United States Patent
Ryu et al.

(10) Patent No.: US 6,855,641 B2
(45) Date of Patent: Feb. 15, 2005

(54) CMOS TRANSISTOR HAVING DIFFERENT PMOS AND NMOS GATE ELECTRODE STRUCTURES AND METHOD OF FABRICATION THEREOF

(75) Inventors: Hyuk-Ju Ryu, Guri-shi (KR); Young-Wug Kim, Seoul (KR); Chang-Bong Oh, Yongin-shi (KR); Hee-Sung Kang, Sungnam-shi (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/421,292

(22) Filed: Apr. 23, 2003

(65) Prior Publication Data

US 2003/0203560 A1 Oct. 30, 2003

(30) Foreign Application Priority Data

Apr. 25, 2002 (KR) ................................ 10-2002-0022681

(51) Int. Cl.[7] ............................................. H01L 21/31
(52) U.S. Cl. ...................... 438/767; 438/706; 438/745; 438/766; 438/778; 438/779
(58) Field of Search ................................. 438/706, 745, 438/766, 767, 778, 779

(56) References Cited

U.S. PATENT DOCUMENTS

| 5,773,348 A | * | 6/1998 | Wu | .............................. 438/305 |
| 6,589,827 B2 | | 7/2003 | Kubo et al. | ................. 438/157 |
| 6,642,112 B1 | * | 11/2003 | Lowe et al. | ................. 438/275 |
| 6,710,382 B2 | | 3/2004 | Kubo et al. | ................. 257/250 |

FOREIGN PATENT DOCUMENTS

| JP | 2002-043566 | 2/2002 | .......... H01L/29/78 |
| WO | WO 01/61749 | 8/2001 | ....... H01L/21/8238 |

* cited by examiner

Primary Examiner—David Nelms
Assistant Examiner—Renee R. Berry
(74) Attorney, Agent, or Firm—Mills & Onello LLP

(57) ABSTRACT

In a CMOS semiconductor device using a silicon germanium gate and a method of fabricating the same, a gate insulating layer, a conductive electrode layer that is a seed layer, a silicon germanium electrode layer, and an amorphous conductive electrode layer are sequentially formed on a semiconductor substrate. A photolithographic process is then carried out to remove the silicon germanium electrode layer in the NMOS region, so that the silicon germanium layer is formed only in the PMOS region and is not formed in the NMOS region.

21 Claims, 12 Drawing Sheets

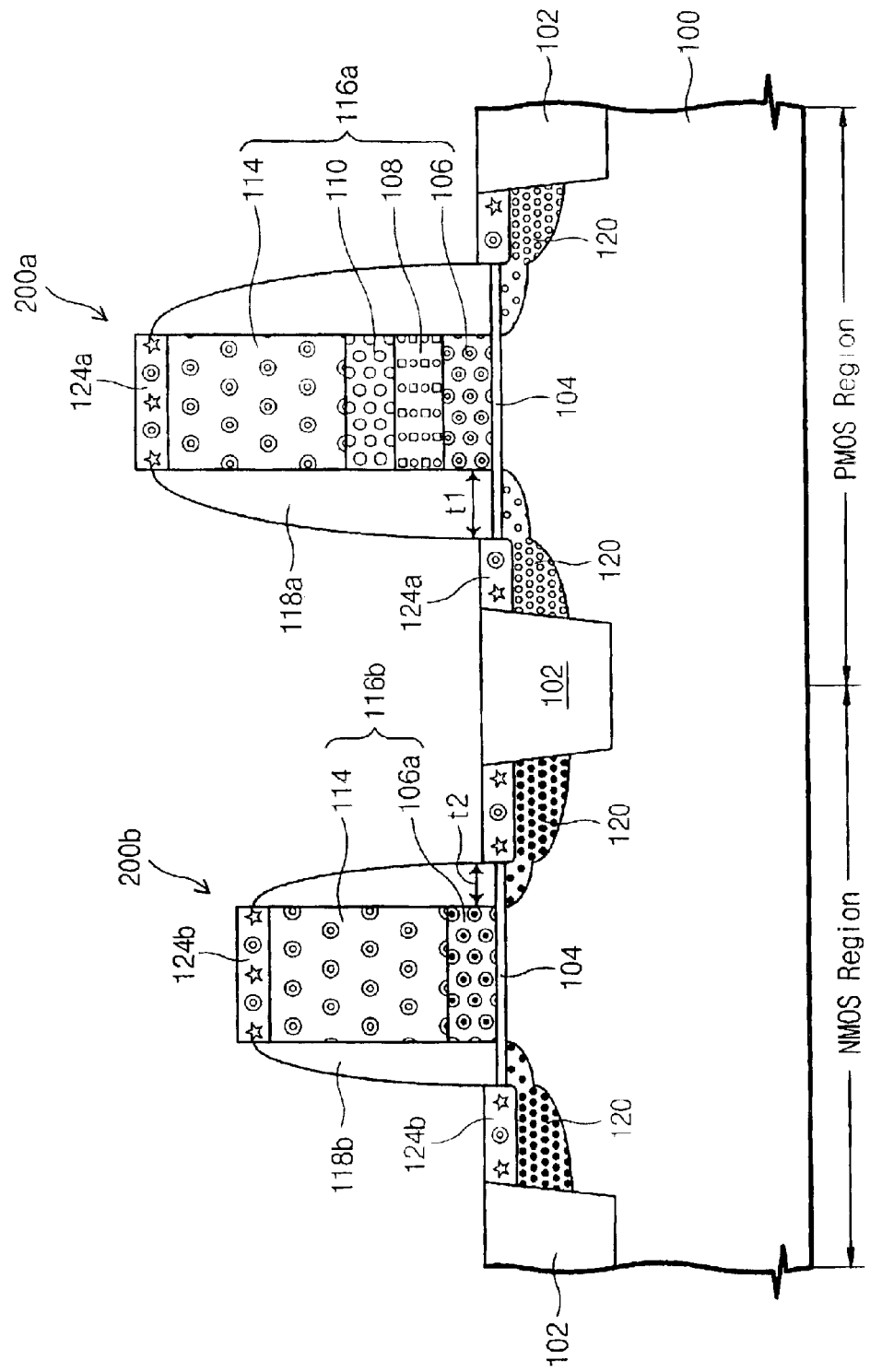

CMOS TRANSISTOR HAVING DIFFERENT PMOS AND NMOS GATE ELECTRODE STRUCTURES AND METHOD OF FABRICATION THEREOF

FIELD OF THE INVENTION

The present invention relates to a semiconductor device having a gate and a method of fabricating the same. More specifically, the present invention is directed to a semiconductor device having a silicon-germanium gate and a method of fabricating the same.

BACKGROUND OF THE INVENTION

P-type or N-type doped polycrystalline silicon (hereinafter referred to as "polysilicon") is generally employed as a gate electrode material for the gate electrode of a MOS transistor. When the gate is formed over a P-type well (i.e., the source and drain are formed with N-type dopants), the resulting structure is referred to as an N-channel MOS (NMOS) structure. In digital applications, NMOS transistors and PMOS transistors are commonly formed on adjacent regions of an integrated circuit. This complementary MOS structure is commonly referred to as a CMOS structure. The drains of the two complementary transistors are connected together and form the output, while the input terminal is the common connection to the transistor gate. CMOS transistors offer the advantages of low power consumption, low operation voltage, high degree of integration, and high noise margin.

CMOS fabrication techniques may be classified into various categories according to the manner in which the gate electrode is formed. Among them, the dual gate technique has widely been used, since the elements incorporated into the device are integrated to a high degree and minimized to increase voltage characteristics and operating speed. In the dual gate technique, P-type and N-type impurities are implanted into respective polysilicon gates of corresponding impurity type transistors. Dual gate type CMOS semiconductor devices offer the advantages of reinforcement of the surface layer portions of the channels and enablement of symmetrical lower voltage operation.

In the fabrication of high performance dual gate type CMOS semiconductor devices, boron is commonly used as a dopant that is doped or implanted into a polysilicon gate layer to form a gate. Usually, doping of the polysilicon gate is carried out concurrently with the implanting of impurities into the semiconductor substrate to form source/drain regions.

However, implanted boron is not uniformly distributed into the polysilicon gate. Namely, the polysilicon gate does not have a uniform doping profile. For example, a portion of the polysilicon gate that neighbors the gate insulating layer (i.e., the lower portion of the polysilicon gate) has a lower doping level than other portions. Furthermore, implanted boron penetrates the thin gate insulating layer and diffuses into the semiconductor substrate (referred to as "boron penetration"). Particularly, boron penetration can be severe in a PMOS transistor having a very thin gate insulating layer on the order of dozens of angstroms. Boron penetration causes variation in the threshold voltage of the semiconductor device. Furthermore, the lower doping level of boron in the lower portion of the polysilicon gate causes a depletion region to form (referred to as "gate polysilicon depletion") when voltage is applied to the gate during operation. Gate polysilicon depletion results in incremental destruction of the equivalent gage insulating layer.

In order to address the issues of boron depletion and gate polysilicon depletion, silicon-germanium (Si-Ge) has become popular for use as a gate material in CMOS-type semiconductor devices. Since germanium offers a higher degree of solubility for boron as compared to conventional polysilicon, boron has a uniform doping profile throughout the silicon-germanium gate, and thus, the possibility of boron out-diffusion (boron penetration) into the channel region is very low.

A silicon-germanium gate is useful in a PMOS transistor for blocking boron penetration and gate polysilicon depletion. However, this does not apply well to the NMOS transistor. Indeed, an NMOS transistor with N-type doped silicon-germanium gate has worse characteristics than NMOS transistor with N-type doped silicon gate without germanium. The use of an N-type silicon-germanium gate in an NMOS transistor carries with it a number of significant disadvantages. N-type dopants such as arsenic and phosphorus that are added to the silicon-germanium gate are difficult to activate, and are easily deactivated again through heating during subsequent manufacturing treatments at elevated temperatures. These non-activated atoms of the dopant give rise to undesired strong depletion of the gate polysilicon.

On the other hand, during a silicon fabrication process using a refractory metal for lowering gate contact resistance, germanium blocks the interaction between polysilicon and the refractory metal in the PMOS transistor. Accordingly, there is a strong need for a new CMOS fabrication technique without the above-described drawbacks.

SUMMARY OF THE INVENTION

A feature of the present invention is to provide a method of fabricating a CMOS type semiconductor device.

Another feature of the present invention is to provide a method of fabricating a CMOS type semiconductor device compatible with the silicide process.

Still another feature of the present invention is to provide a CMOS type semiconductor device with an asymmetrical gate structure.

In a PMOS transistor, in order to suppress gate polysilicon depletion and in order to form a suitable silicide layer, germanium is preferably distributed only at a lower portion of the gate stack structure adjacent to the gate insulating layer while not being distributed at an upper portion of the gate stack structure adjacent to the refractory metal layer. According to the present invention, a silicon germanium layer is formed on a gate insulating layer. An amorphous layer is formed below a polysilicon layer constituting an upper portion of a gate for forming a silicide layer (i.e., between the silicon germanium layer and the polysilicon layer). The amorphous layer prevents the germanium from diffusing into the polysilicon layer constituting the upper portion of the gate. In order to secure uniformity in the thickness of the silicon germanium layer and in order to enhance a surface characteristic thereof, a conductive layer for seeding is preferably further formed between the gate insulating layer and the silicon germanium layer. The conductive layer for seeding is preferably made of polysilicon, making it possible to diffuse the germanium. The amorphous layer is preferably made of amorphous silicon. Accordingly, the amorphous layer serves to prevent the germanium from diffusing to the upper portion of the gate stack structure (i.e., polysilicon layer). However, in the lower portion of the gate stack structure, the germanium diffuses into the seeding conductive layer, i.e., polysilicon layer. That is, the amorphous silicon layer and the polysilicon layer for seeding are formed over and under the silicon germanium layer, respectively. Since amorphous silicon and seeding polysilicon are different in germanium diffusion characteristics, the germanium diffuses only to the lower portion of the gate, not to the upper portion thereof, during subsequent annealing processes.

In the case of an NMOS transistor, a silicon germanium layer must not be formed, in order to prevent gate polysilicon depletion. In view of this, a gate insulating layer, an optional conductive layer for seeding, a silicon germanium layer, and an amorphous conductive layer are sequentially formed on a semiconductor substrate. A photolithographic process is carried out to remove an amorphous layer and a silicon germanium layer in an NMOS region where an NMOS transistor is formed. Thus, a silicon germanium layer remains in the PMOS region where a PMOS transistor is to be formed. A mask pattern is formed on the amorphous layer such that the NMOS region is exposed and a PMOS region is not exposed. A dry etch employing a main etch is carried out, so that the amorphous conductive layer is completely removed and an underlying silicon germanium layer is almost removed. By means of a wet etch, the remaining silicon germanium layer is selectively removed. As a result, the silicon germanium layer is removed in the NMOS region and remains only in the PMOS region.

More specifically, a method of forming a semiconductor device using a silicon germanium gate comprises forming a device isolation region in a semiconductor substrate to define an NMOS region and a PMOS region thereof, forming a gate oxide layer on a semiconductor substrate where the device isolation region is formed, sequentially forming a silicon germanium layer and an amorphous conductive layer on the gate oxide layer, removing the amorphous conductive layer and the silicon germanium layer in the NMOS region, forming a polysilicon layer on the semiconductor substrate in the NMOS region, and until the gate insulating layer is exposed, patterning the stacked conductive layers to form a gate electrode at the NMOS and PMOS regions.

In a preferred embodiment, the removing the amorphous conductive layer and the silicon germanium layer in the NMOS region comprises forming a mask pattern on the amorphous conductive layer in the PMOS region, performing a dry etch using the mask pattern, and performing a wet etch after removal of the mask pattern. The dry etch is carried out to remove the amorphous conductive layer and a portion of an underlying silicon germanium layer. Further, the wet etch is carried out to selectively remove a remaining portion of the amorphous conductive layer exposed by the dry etch.

More specifically, the dry etch employs gas containing carbon atoms and fluorine atoms, for example, $CF_4$ gas. The wet etch employs a mixed etchant of $HNO_3$ and $H_2O_2$. Preferably, the wet etch employs a mixed etchant $HNO_3$ of 1.2 volume percent and $H_2O_2$ of 4.8 volume percent.

The amorphous conductive layer may be made of any one of conductive materials enough to prevent the germanium diffusion in an annealing process but is preferably made of amorphous silicon.

In the preferred embodiment, after forming the gate oxide layer before forming the silicon germanium layer, a seeding layer for the silicon germanium layer is formed. Preferably, the seeding layer is formed of silicon. In the event that the silicon layer for seeding is further formed, the removing the amorphous conductive layer and the silicon germanium layer on the NMOS region comprises forming a mask pattern so as not to cover the NMOS region, performing a dry etch using the mask pattern, removing the mask pattern, and performing a wet etch. The dry etch is carried out to remove the amorphous conductive layer and a portion of an underlying silicon germanium layer. Further, the wet etch is carried out to selectively remove the remaining silicon germanium layer until the silicon layer for seeding is exposed.

Preferably, the silicon layer for seeding comprises polysilicon to easily diffuse germanium.

In a case where the silicon layer for seeding is formed, after forming the mask pattern or prior to removal of the make pattern, an ion implanting process is preferably further carried out to dope a lower portion of the NMOS gate electrode. Here the ion implanting process is to implant N-type impurities into the silicon layer for seeding on the NMOS region.

An annealing process may further be performed out in order to diffuse germanium downwardly. Preferably, the annealing process for germanium diffusion is performed after patterning the conductive layers stacked on the gate insulating layer. However, the annealing process may be performed in any one of subsequent processes performed after forming the silicon germanium layer. The annealing process is performed at a temperature of 100–1200° C. for 0–10 seconds. Here, the "0 second" means that the annealing process is not performed.

In this method, an amorphous conductive layer is formed between the silicon germanium layer and an overlying polysilicon layer to prevent germanium from diffusing to the polysilicon layer constituting an upper side of the gate in the annealing process for germanium diffusion. Therefore, it is possible to prevent a silicide layer from being deteriorated by the germanium diffusion.

According to another aspect of the present invention, a method of fabricating a semiconductor device using a silicon germanium gate comprises forming a gate oxide layer on a semiconductor substrate, a device isolation region being formed on the substrate to define an NMOS region and a PMOS region, forming a lower polysilicon electrode layer for seeding on the gate oxide layer, forming a silicon germanium electrode layer on the lower polysilicon electrode layer for seeding, forming an amorphous electrode layer on the silicon germanium electrode layer, forming a mask pattern on the amorphous electrode layer in the PMOS region so as not to cover the NMOS region, dry-etching the amorphous electrode layer and a portion of the underlying silicon germanium electrode layer in the NMOS region exposed by the mask pattern, removing the mask pattern, selectively wet-etching a remaining portion of the silicon germanium electrode layer exposed by the dry etch until the lower polysilicon electrode layer for seeding is exposed in the NMOS region, forming an upper polysilicon electrode layer on the lower polysilicon electrode layer for seeding in the NMOS region and the silicon germanium electrode layer in the PMOS region, and patterning the stacked electrode layers to form a gate electrode in the NMOS and PMOS regions.

In a preferred embodiment, the method may further comprise performing an annealing process for diffusing germanium of the silicon germanium electrode layer to the lower polysilicon layer for seeding. Preferably, the annealing process is performed after patterning the stacked conductive layers. However, the annealing process may be performed in any one of subsequent processes performed after forming the silicon germanium electrode layer.

In the annealing process for germanium diffusion, the amorphous conductive layer formed on the silicon germanium layer serves to prevent the germanium from diffusing to the upper polysilicon electrode layer.

In a preferred embodiment, the method further comprises after forming a gate electrodes in each of the NMOS and PMOS regions, forming an insulating layer sidewall spacer on both sidewalls of the respective gate electrode; using the sidewall spacer and the gate electrode as an ion implanting mask, forming source/drain regions in the semiconductor substrate adjacent side portions of the respective gate electrodes; and a refractory metal layer for silicide on an entire surface of a semiconductor substrate where the source/drain regions are formed. The refractory metal layer may be made of, for example, titanium or cobalt.

According to still another aspect of the present invention, a CMOS semiconductor device comprises a gate constituting an NMOS transistor and a gate constituting a PMOS transistor. The gate constituting the NMOS transistor has an optional polysilicon layer for seeding and an upper polysilicon layer. The gate constituting the PMOS transistor has an optional polysilicon layer for seeding, a silicon germanium layer, an amorphous conductive (amorphous silicon) layer, and an upper polysilicon layer. The CMOS semiconductor device further comprises refractory metal silicide layers formed on an upper side of a gate electrode of the respective transistors and a sidewall spacer formed on a sidewall of the gate electrode. As a PMOS gate becomes higher than an NMOS gate, the resulting PMOS sidewall spacer becomes longer in height and wider in thickness than the NMOS sidewall spacer. Thus, it is possible to suppress leakage current or punchthrough of the PMOS transistor, which heavily suffers from the short channel effect as compared to an NMOS transistor.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIG. 12 is a cross-sectional view which partially shows a semiconductor device according to the present invention.

DETAILED DESCRIPTION OF PREFERRED EMBODIMENTS

Figure 1:
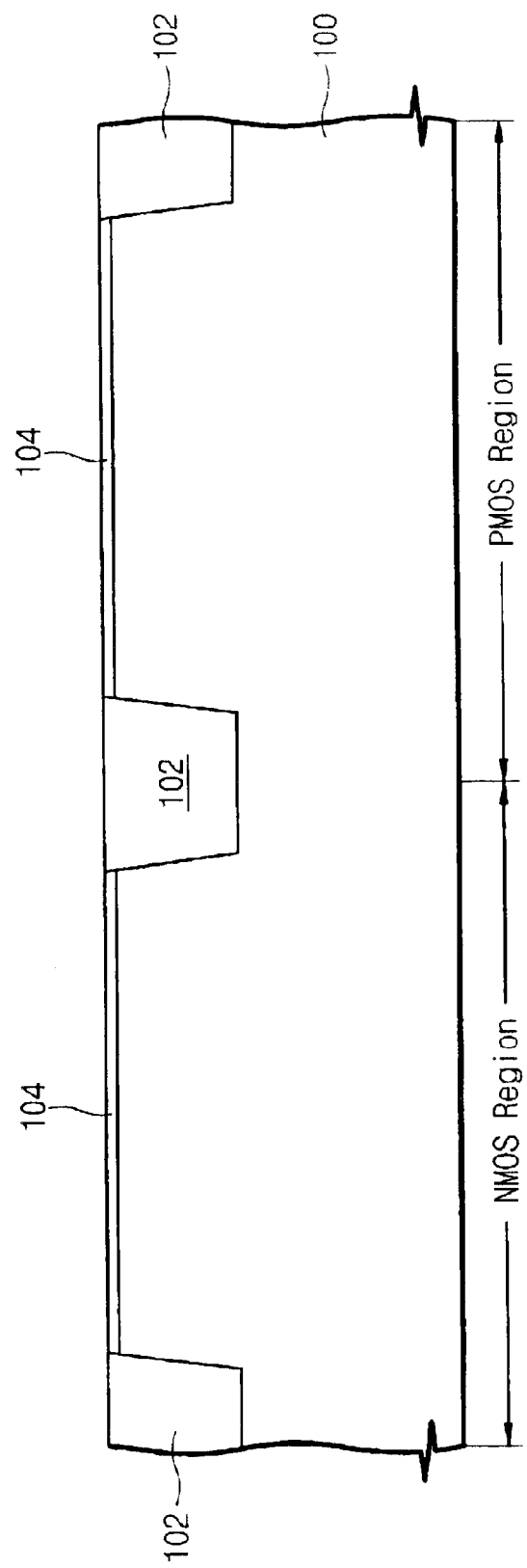
FIG. 1 through FIG. 11 are cross-sectional views which partially show a semiconductor substrate during several steps of a method of fabricating a semiconductor device according to the present invention.

First, a structure of a semiconductor device according to the present invention will now be described with reference to FIG. 12.

As illustrated in FIG. 12, a semiconductor device includes a PMOS transistor 200a and an NMOS transistor 200b formed on a semiconductor substrate 100. The PMOS and NMOS transistors are electrically isolated by a device isolation region 102. The PMOS transistor 200a has a stacked gate electrode 116a and source/drain regions 120. A gate insulating layer 104 is interposed between the semiconductor substrate 100 and the stacked gate electrode 116a. The source/drain 120 is formed in a semiconductor substrate adjacent to opposite sides of the stacked gate electrode 116a. The NMOS transistor also has a stacked gate electrode 116b and source/drain 120 regions. A gate insulating layer 104 is interposed between the semiconductor substrate 100 and the stacked gate electrode 116b. The source/drain 120 is formed in a semiconductor substrate adjacent opposite sides of the stacked gate electrode 116b. However, the gate electrodes of the PMOS and NMOS transistors are different in constituent and height. The gate electrode of the PMOS transistor is higher than that of the NMOS transistor. Specifically, the PMOS gate, electrode 116a consists of a lower polysilicon layer 106 for seeding, a silicon germanium layer 108, an amorphous conductive layer 110, and an upper polysilicon layer 114. The NMOS gate electrode 116b consists of a lower polysilicon layer 106 for seeding and an upper polysilicon layer 114. The semiconductor device further comprises refractory metal layers 124a and 124b and sidewall spacers 118a and 118b. The refractory metal layers 124a and 124b are formed on the PMOS and NMOS gate electrodes 106b and 106a, respectively.

The spacers 118a and 118b are made of an insulator material and are disposed on sidewalls of the gate electrodes 116a and 116b, respectively. The spacers 118a and 118b of the respective PMOS and NMOS transistors are different in size, which characterizes the semiconductor device according to the present invention. The PMOS sidewall spacer 118a is larger in width than the NMOS sidewall spacer 118b (i.e., t1>t2), as shown in FIG. 12. This makes it possible to suppress leakage current or punchthrough of the PMOS transistor which suffers greatly from short channel effects.

Now, a method of fabricating a CMOS semiconductor device having different gate electrode structures is described below. FIG. 1 through FIG. 11 partially illustrate a semiconductor substrate in several steps of a method of fabricating a semiconductor device using a silicon germanium gate according to the preferred embodiment of the invention.

Referring to FIG. 1, a gate insulating layer 104 is formed at a semiconductor substrate 100. Conventionally, impurities are implanted into the substrate 100 to form a well prior to formation of the gate insulating layer 104, a device isolation process is performed by a shallow trench isolation (STI) manner to form a device isolation layer 102, and a channel ion implanting process is performed. The device isolation layer 102 defines an NMOS region, where an NMOS transistor is formed, and a PMOS region, where a PMOS transistor is formed. The device isolation process and the channel ion implanting process are well known in the art, and therefore are not described in further detail herein. The gate insulating layer 104 has a thickness of 40–70 angstroms and can be different in thickness in the NMOS and PMOS regions. In the case of a state-of-the-art dual CMOS-type semiconductor device, the gate insulating layer 104 of the PMOS transistor may have a thickness of 20–40 angstroms in order to form a high-performance device and achieve high integration density. The gate insulating layer 104 is formed, for example, of a silicon oxide which is formed by oxidizing the substrate at a high temperature in an oxygen ambient, and may be made of silicon oxynitride.

Figure 2:
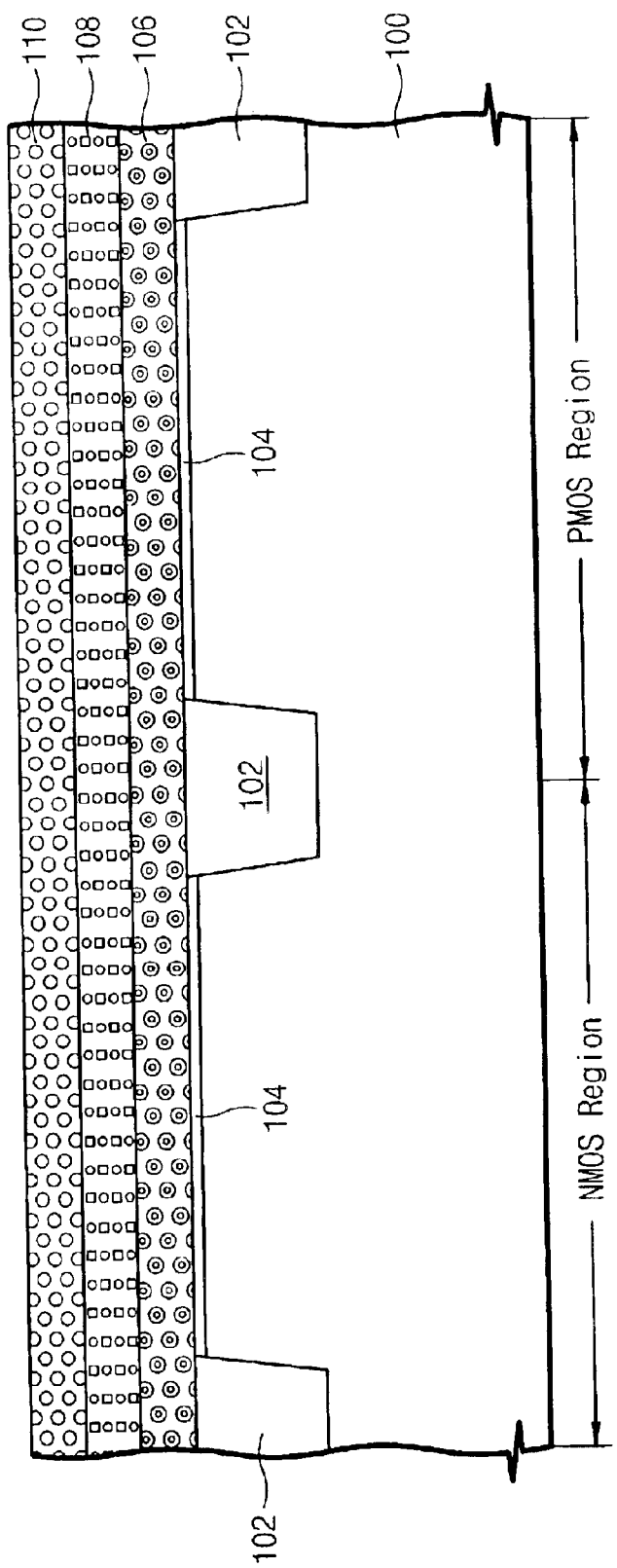

Referring to FIG. 2, a silicon layer 106 for seeding, a silicon germanium (SiGe) layer 108, and an amorphous conductive layer 110 are sequentially stacked on an entire surface of a semiconductor substrate 100 where the gate insulating layer 104 is formed. Specifically, the silicon layer 106 for seeding is formed to a thickness of 0–500 angstroms. Here, "0" angstroms means that, in that case, the silicon layer 106 for seeding is not formed. However, to efficiently form a silicon germanium layer in a subsequent process, the silicon layer 106 for seeding is preferably formed prior to formation of the silicon germanium layer. Therefore, the silicon layer 106 for seeding serves to expedite diffusion of germanium in subsequent annealing processes so as to prevent polysilicon depletion at the lower portion of the gate. Preferably, the silicon layer 106 for seeding has a minimal thickness (e.g., 50 angstroms) required in its function. The silicon layer 106 for seeding is preferably formed of polysilicon.

The silicon layer 106 for seeding may be formed by a chemical vapor deposition (CVD) technique that is carried out to form polysilicon by maintaining a temperature of 500–600° C. at a pressure of several Torr through normal pressure using a source gas such as silane gas ($SiH_4$).

Similarly, the silicon germanium layer 108 is formed. For example, it can be formed by the CVD technique that is carried out at a suitable temperature using silane gas ($SiH_4$) and $GeH_4$ gas. In this case, the content of germanium may be adjusted by suitably adjusting the flow rates of the source gases (i.e., $SiH_4$ and $GeH_4$ gases). The silicon germanium may become crystalline or amorphous depending on process temperature.

This invention is characterized in part by the amorphous conductive layer 110 that may be formed of any conductor to prevent germanium from diffusing upwardly toward an upper portion of a gate. Preferably, the amorphous conductive layer 110 is formed of amorphous silicon. Further, the amorphous conductive layer 110 operates as a hard mask when a silicon germanium layer is removed in the NMOS region. The thickness of the amorphous conductive layer 110 is larger than a minimal thickness required in its function. For example, the amorphous conductive layer 110 has a thickness range between 10 angstroms and 500 angstroms. In a case where the amorphous conductive layer 110 is formed of amorphous silicon, the method of forming polysilicon by employing the foregoing CVD manner is used. Process temperature is adjusted to form an amorphous layer. Alternatively, the amorphous conductive layer 110 may be formed by a suitable deposition process such as a physical vapor deposition (PVD).

Figure 6:
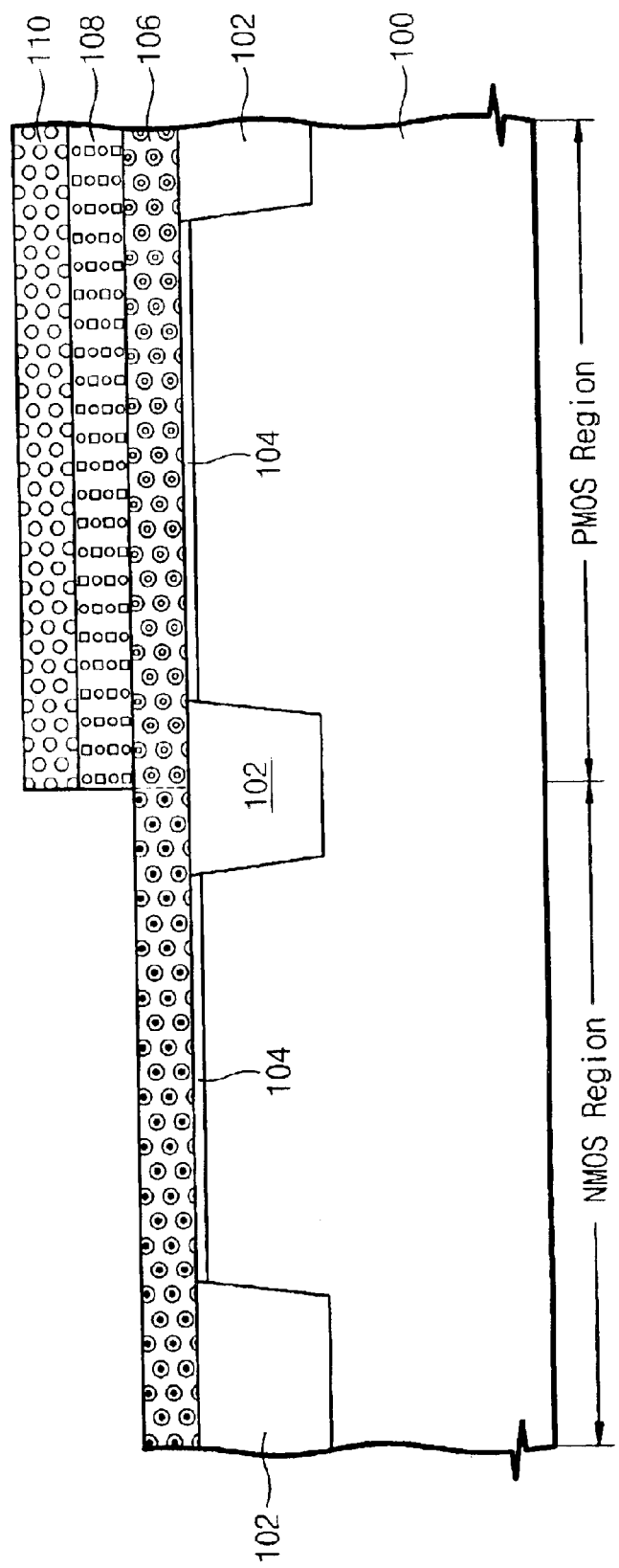

Next, the amorphous layer 110 and the silicon germanium layer 108 are removed in the NMOS region (see FIG. 6). In order to remove them, the present invention employs a two-step etching process. In a first etching step, the amorphous layer 110 is completely etched and the silicon germanium layer 108 is partially etched. In a second etching step, a residue of the silicon germanium layer 108 is etched. The first etching step uses a dry etch technique, and the second etching step uses a wet etch technique.

Figure 3:
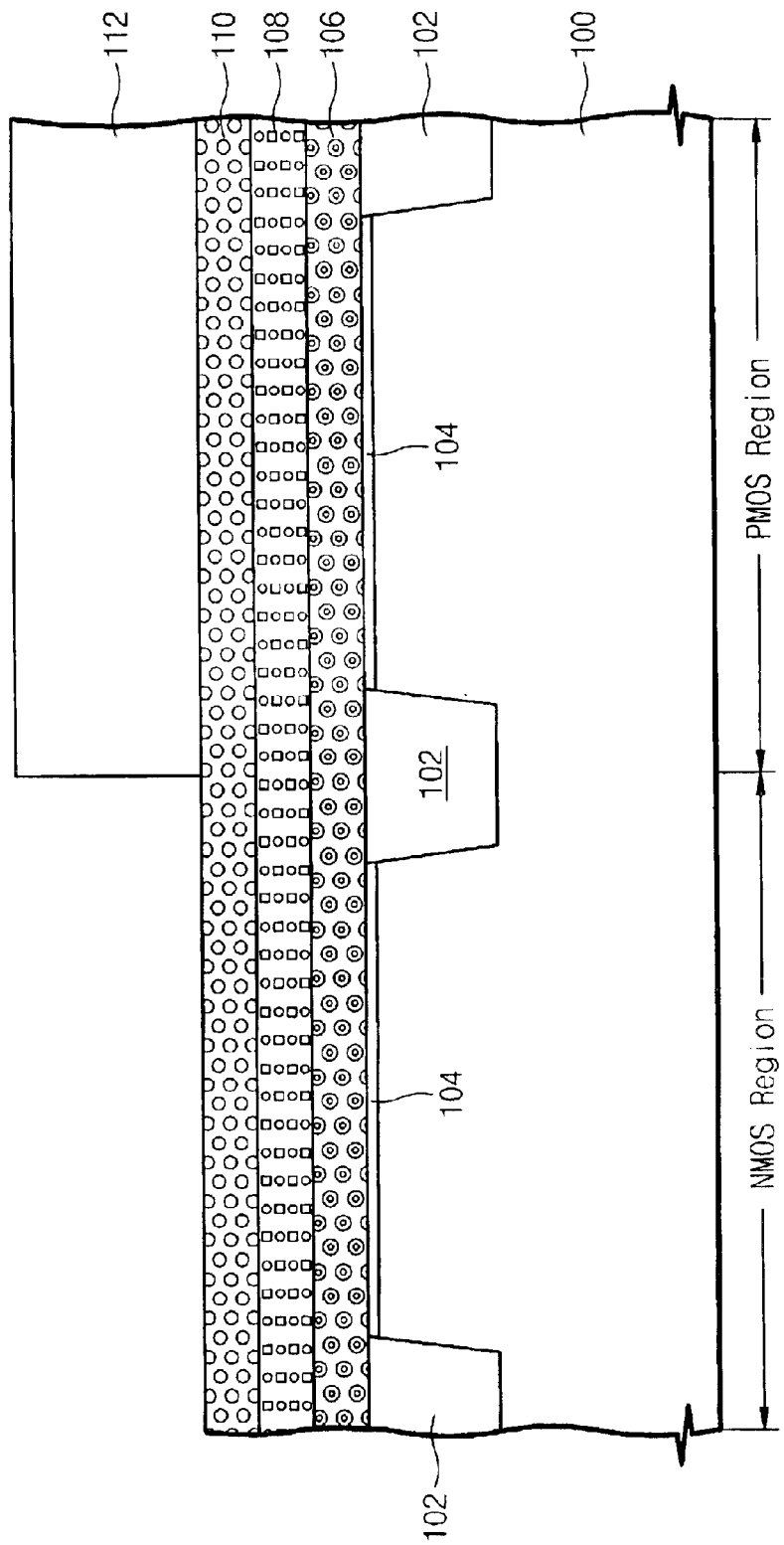

More specifically, referring to FIG. 3, a hard mask pattern 112 is formed on a semiconductor substrate 100 where the amorphous conductive layer 110 is formed. The mask pattern 112 exposes the NMOS region and covers the PMOS region. Thus, the amorphous layer 110 in the NMOS region is exposed. For example, the mask pattern 112 is formed by performing an exposing process and a developing process after coating the photoresist layer.

Figure 4:
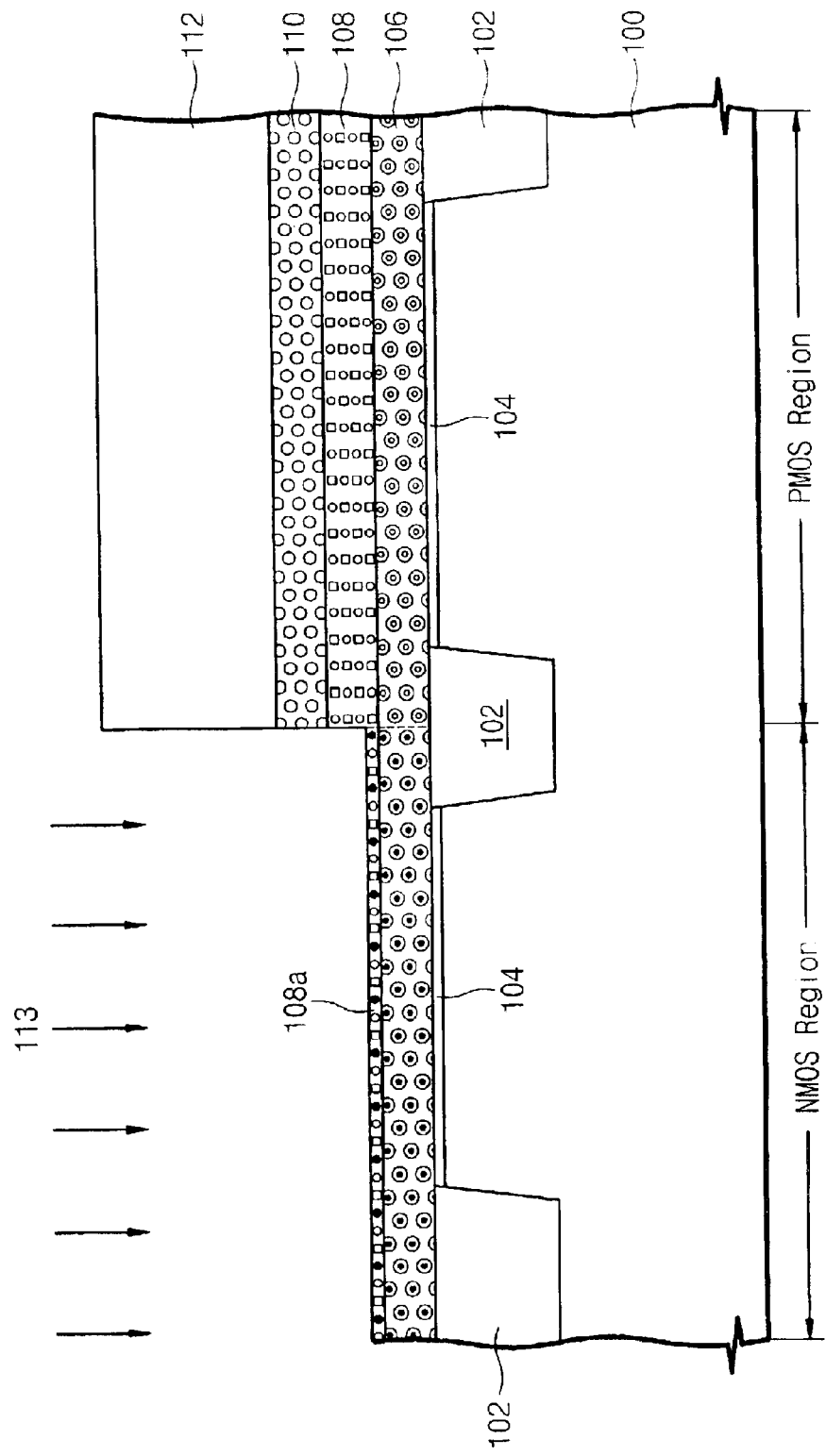

Referring to FIG. 4, as a first dry etch, a dry etch is carried out to completely etch the amorphous layer 110 and to partially etch the silicon germanium layer in the NMOS region exposed by the mask pattern 112. The dry etch uses a gas containing carbon atoms and fluorine atoms. For example, $CF_4$ gas is used and argon gas is used as carrier gas. Following the dry etch, an ion implanting process 113 is performed for doping a gate in the NMOS region. As the doping ions, N-type phosphorus or arsenic ions are used. They are implanted into a silicon layer 106 for seeding in the NMOS region at an energy level of, for example, 1–100 KeV.

Figure 5:
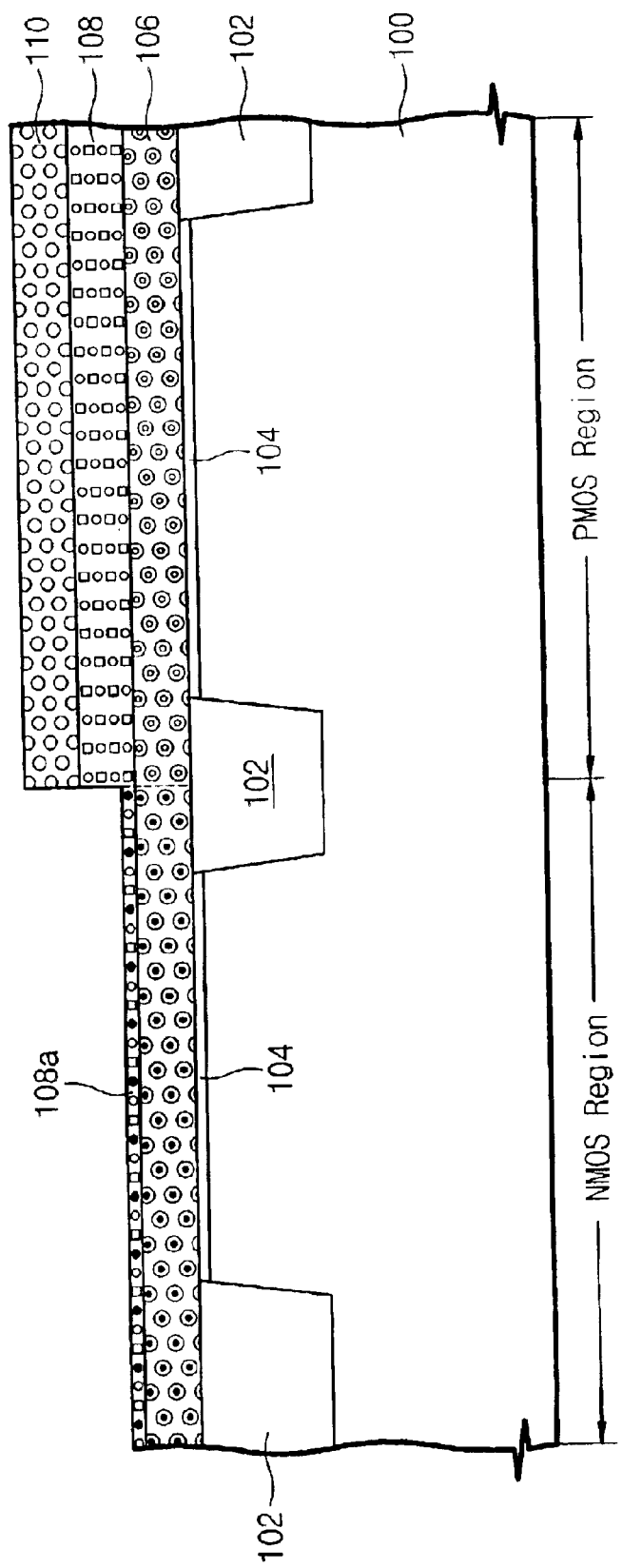

As shown in FIG. 5, after the dry etch is carried out, the mask pattern 112 is removed to expose an amorphous conductive layer 110 in a PMOS region. On the other hand, as a result of the dry etch, a remaining silicon germanium layer 108a is exposed in the NMOS region.

Following removal of the mask pattern 112, as a second etch, a wet etch is carried out to remove the remaining silicon germanium layer 108a in the NMOS region as shown in FIG. 6. In the PMOS region, an amorphous conductive layer 110 remaining on a silicon germanium layer acts as a hard mask. For this reason, the underlying silicon germanium layer is protected from the wet etch. The wet etch uses, for example, a mixed etchant of $HNO_3$ and $H_2O_2$ solutions. More specifically, the wet etch uses a mixed etchant of $HNO_3$ of 1.2 volume percent and $H_2O_2$ of 4.8 volume percent.

Figure 7:
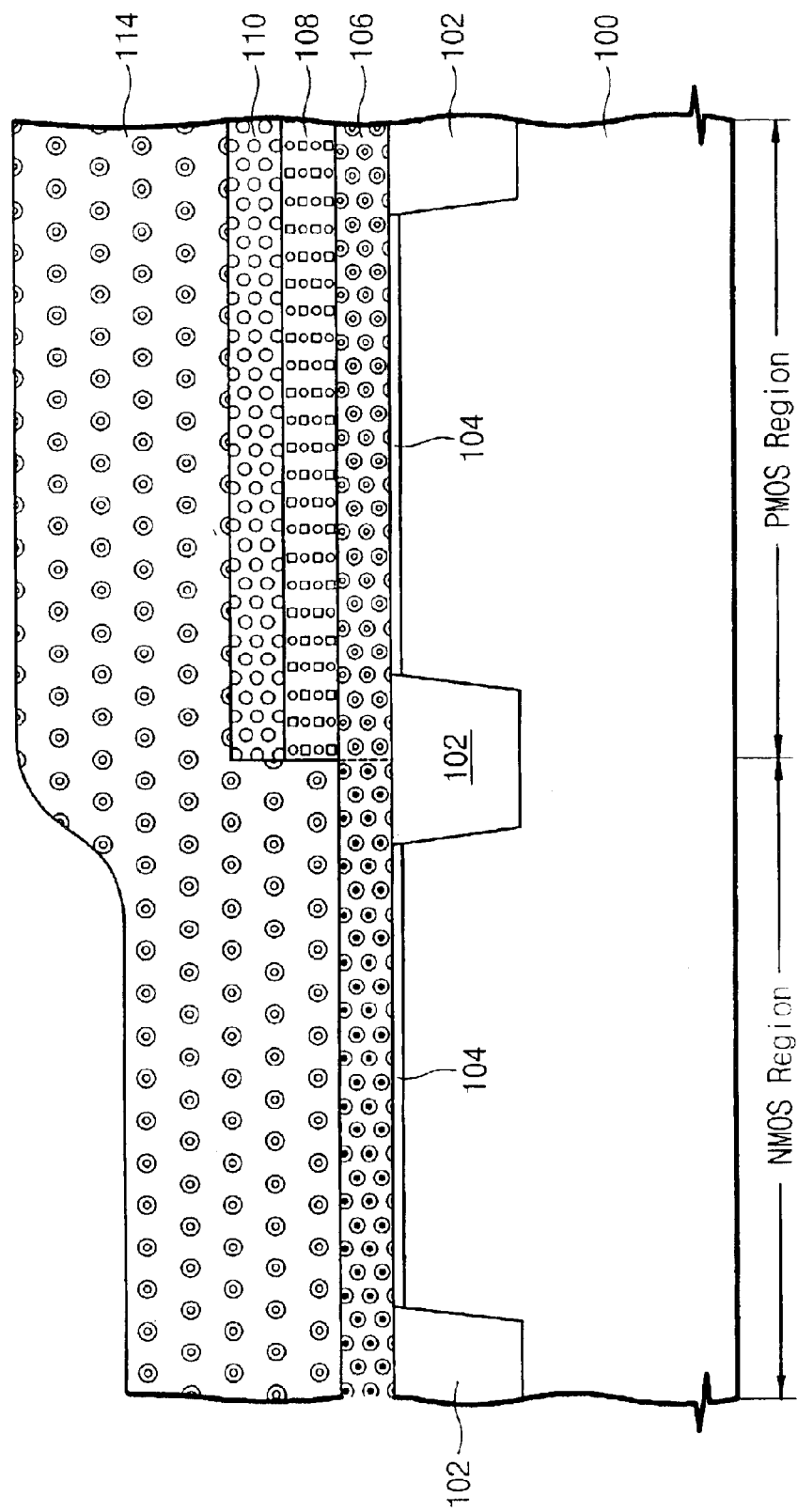

Referring to FIG. 7, an additional silicon layer 114 is formed on an entire surface of a semiconductor substrate where the silicon layer 106 for seeding is exposed in the NMOS region and an amorphous silicon layer 110 is exposed in the PMOS region. The additional silicon layer 114 will eventually constitute a portion of the final gate stack structure. Preferably, the additional silicon layer 114 is formed under the same conditions as the silicon layer 106 for seeding. The thickness of the additional silicon layer 114 is determined in consideration of the thicknesses of the other previously formed layers and the overall desired thickness of the final gate stack structure. The additional silicon layer 114 may have a thickness of, for example, 100–2000 angstroms.

Figure 8:
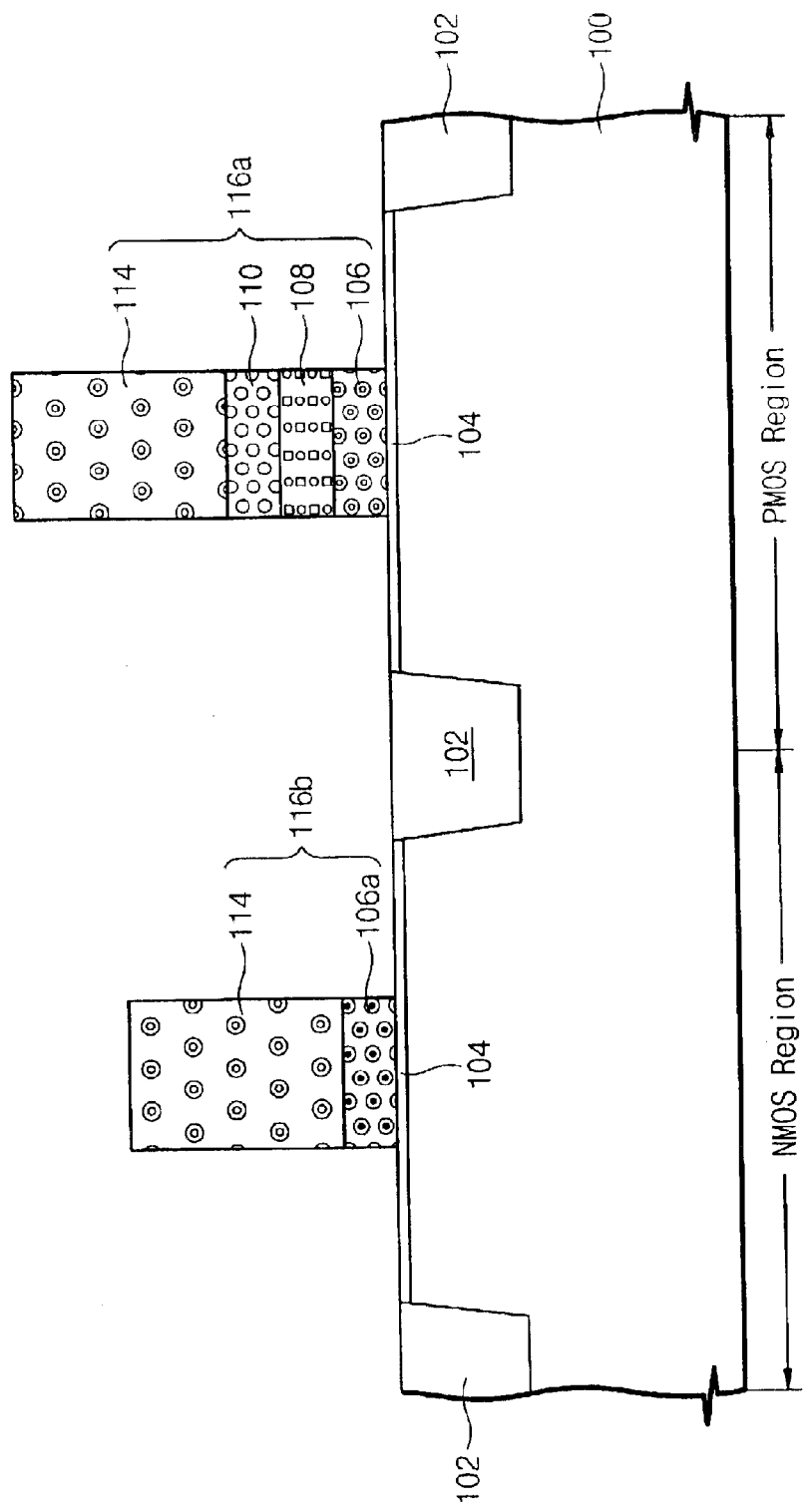

By a photolithographic process, the stacked layers are patterned to form gate electrodes 116a and 116b in PMOS and NMOS regions respectively (see FIG. 8). As a result, in the PMOS region, the silicon layer 106 for seeding, the silicon germanium layer 108, the amorphous conductive layer 110, and the additional silicon layer 114 constitute the gate electrode 116a. Further, in the NMOS region, the silicon layer 106a for seeding and the additional silicon layer 114 constitute the gate electrode 116b.

To prevent polysilicon depletion of the silicon layer 106 constituting the lowest part of the gate electrode in the PMOS region, a germanium diffusion annealing process is carried out so that the germanium of the silicon germanium layer 108 stacked thereon can be diffused to the silicon layer 106 for seeding. Consequently, in the PMOS region, the germanium is sufficiently distributed at the lowest part of the gate electrode. At a lower part of the gate electrode, boron ions implanted for doping the PMOS gate are dissolved sufficiently enough to prevent the gate polysilicon depletion. However, the germanium is not diffused into the additional silicon layer 114 that constitutes the upper part of the gate electrode and reacts with the refractory metal so as to form a silicide layer. This is because the amorphous conductive layer 110 serving to prevent germanium diffusion is interposed between the additional silicon layer 114 and the silicon germanium layer 108.

Figure 9:
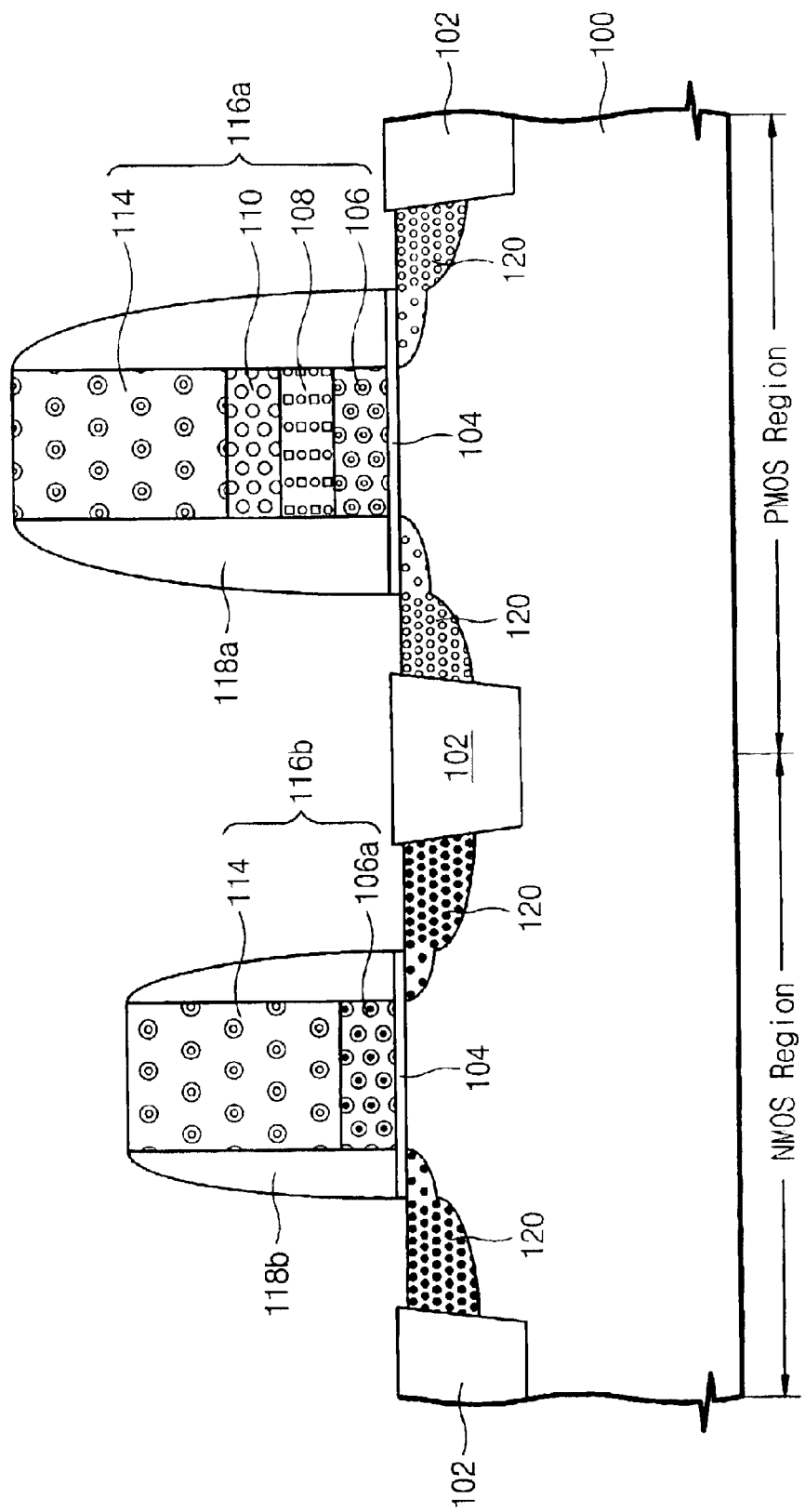

Referring to FIG. 9, a sidewall spacer process and a source/drain formation process are carried out to form sidewall spacers 118a and 118b on sidewalls of PMOS and NMOS gate electrodes respectively and to form source/drain 120 regions in the semiconductor substrate (well) adjacent to opposite sides of the gate electrodes 116a, 116b. The sidewall spacer process and the source/drain process are well known in the art and will not be described in further detail.

To be described briefly, after conformally depositing an insulating layer, an isotropic etch is carried out. As a result, the insulating layer remains only on the sidewall of the gate electrode to from a sidewall spacer. Since the gate electrodes are different in height, the resulting sidewall spacers formed thereon are different in thickness. That is, the sidewall spacer formed on the PMOS gate electrode is larger in thickness than the sidewall spacer formed on the NMOS gate electrode. After forming the sidewall spacer, N-type and P-type impurities are heavily doped and an annealing process are carried out to form the source/drain regions. In the case where a lightly doped drain (LDD) source/drain structure is formed, impurities are lightly applied to the resulting structure before forming the sidewall spacer. In the PMOS transistor, the gate is doped at the same time the source/drain regions are formed.

Figure 10:
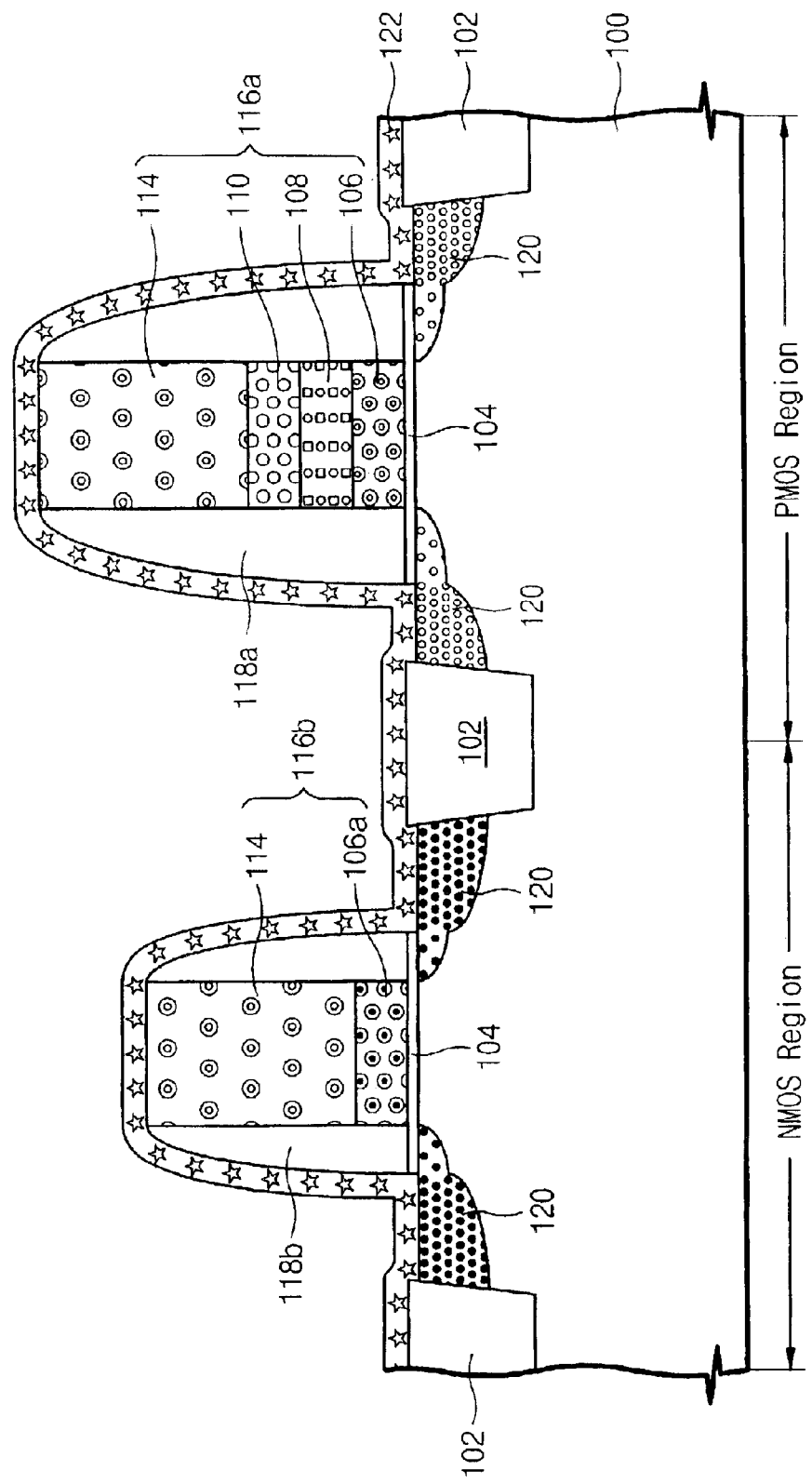

Next, a silicide process is carried out to form a low-resistance contact between a metal interconnection and a gate electrode. Referring to FIG. 10, after forming the sidewall spacers 118a and 118b and source/drain 120, a refractory metal layer 122 is formed on an entire surface of the semiconductor substrate. The refractory metal layer 122 is made of, for example, cobalt or nickel.

Figure 11:
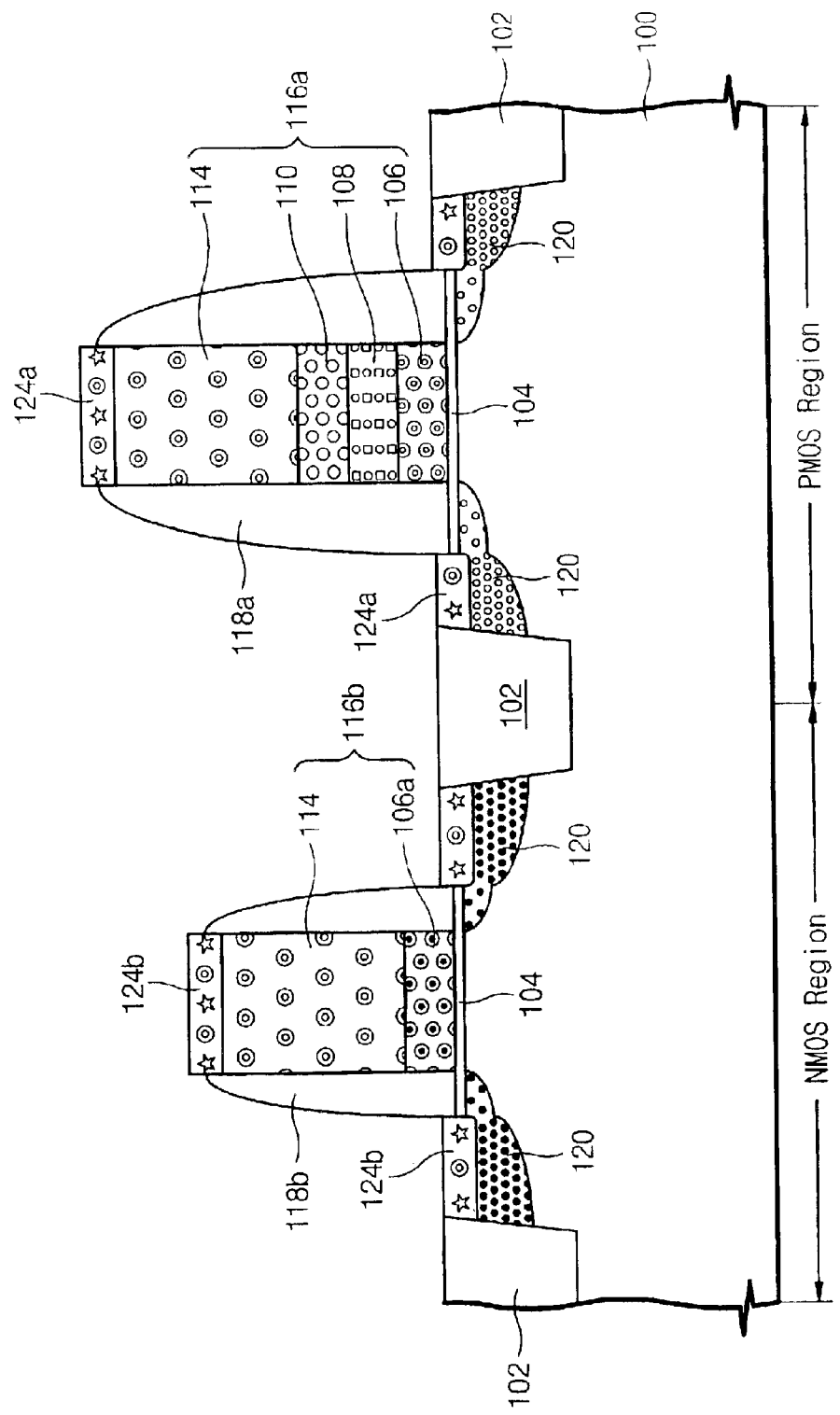

Referring to FIG. 11, a suicide annealing process is carried out to form silicide layers 124a and 124b on the gate electrode and source/drain regions. As previously described, in the PMOS region, the amorphous conductive layer 110 prevents germanium from diffusing upwards to the additional silicon layer 114 during the source/drain activation annealing process or the germanium diffusion annealing process. Therefore, it is possible to suppress silicide characteristic deterioration caused by the germanium. Following formation of the silicide layer, an interconnection process is conventionally carried out.

In summary, different gate electrode structures for the PMOS and NMOS transistors are formed in order to prevent gate polysilicon depletion and boron penetration in the PMOS region. Further, since a mask used for doping the NMOS gate in the conventional CMOS process is used, the silicon germanium layer in an NMOS region can be removed in a relatively simplified procedure. Additionally, after forming an amorphous conductive layer on the silicon germanium layer, a patterning process is carried out to easily remove the silicon germanium layer in the NMOS region and to prevent germanium from diffusing upwardly toward the gate. As a result, it is possible to suppress deterioration of a silicide layer.

While this invention has been particularly shown and described with references to preferred embodiments thereof, it will be understood by those skilled in the art that various changes in form and detail may be made herein without departing from the spirit and scope of the invention as defined by the appended claims.

For example, although a germanium diffusion annealing process is carried out after patterning the gate electrode in the foregoing embodiment of the invention, it may alternatively be carried out following formation of the germanium silicon layer and is preferably carried out at any time prior to forming the source/drain regions. In addition, as previously described, the germanium diffusion annealing process may be skipped. Moreover, following formation of a mask pattern 112 on an amorphous conductive layer 110 (see FIG. 3), a process of doping the gate in the NMOS region may be carried out after patterning the gate.

What is claimed is:

1. A method of fabricating a semiconductor device, comprising:
    forming a gate oxide layer on a semiconductor substrate, a device isolation region being formed on the substrate to define an NMOS region and a PMOS region;
    sequentially forming a silicon germanium layer and an amorphous conductive layer on the gate oxide layer;
    removing the amorphous conductive layer and the silicon germanium layer in the NMOS region;
    forming a polysilicon layer in the NMOS and PMOS regions; and
    patterning the polysilicon layer in the NMOS region until the gate insulating layer is exposed and patterning the polysilicon layer, the amorphous conductive layer and the silicon germanium layer in the PMOS region until the gate insulating layer is exposed to form gate electrodes in the NMOS and PMOS regions.

2. The method as recited in claim 1, wherein the removing the amorphous conductive layer and the silicon germanium layer in the NMOS region comprises:
    forming a mask pattern on the amorphous conductive layer in the PMOS region;
    performing a dry etch using the mask pattern; and
    performing a wet etch after removing the mask pattern.

3. The method as recited in claim 2, wherein the dry etch is performed to completely remove the amorphous conductive layer an to partially remove the underlying silicon germanium layer.

4. The method as recited in claim 3, wherein the wet etch is performed to selectively remove a residue of the amorphous conductive layer exposed by the dry etch.

5. The method as recited in claim 2, wherein the dry etch uses a gas containing carbon atoms and fluorine atoms and the wet etch uses a mixed etchant of $HNO_3$ and $H_2O_2$ solutions.

6. The method as recited in claim 1, wherein the amorphous conductive layer is made of amorphous silicon.

7. The method as recited in claim 1, further comprising forming a silicon seeding layer for the silicon germanium layer after forming the gate oxide layer and before forming the silicon germanium layer.

8. The method as recited in claim 7, wherein the removing the amorphous conductive layer and the silicon germanium layer in the NMOS region comprises:
    forming a mask pattern on the amorphous conductive layer in the PMOS region;
    performing a dry etch using the mask pattern
    removing the mask pattern; and
    performing a wet etch,
    wherein the dry etch is performed to completely etch the amorphous conductive layer and to partially etch the underlying silicon germanium layer and the wet etch is performed to selectively etch a remaining portion of the silicon germanium layer down to a top surface of the silicon layer for seeding.

9. The method as recited in claim 7, wherein the silicon seeding layer comprises polysilicon.

10. The method as recited in claim 9, further comprising implanting impurities into the silicon seeding layer after forming the mask pattern or performing the dry etch before removing the mask pattern.

11. The method as recited in claim 8, wherein the dry etch uses a gas containing carbon atoms and fluorine atoms and the wet etch uses a mixed etchant of $HNO_3$ and $H_2O_2$ solutions.

12. The method as recited in claim 7, further comprising annealing the semiconductor substrate at any time after forming the silicon germanium layer.

13. A method of fabricating a semiconductor device, comprising:
   forming a gate oxide layer on a semiconductor substrate, a device isolation region being formed on the substrate to define an NMOS region and a PMOS region;
   forming a lower polysilicon electrode seeding layer on the gate oxide layer;
   forming a silicon germanium electrode layer on the lower polysilicon electrode seeding layer;
   forming an amorphous electrode layer on the silicon germanium electrode layer;
   forming a mask pattern on the amorphous electrode layer in the PMOS region so as to expose the NMOS region;
   dry-etching the amorphous electrode layer an a portion of the underlying silicon germanium electrode layer in the NMOS region exposed by the mask pattern;
   removing the mask pattern;
   selectively wet-etching a residue of the silicon germanium electrode layer exposed by the dry etch down to a top surface of the lower polysilicon electrode seeding layer in the NMOS region;
   forming an upper polysilicon electrode layer on the lower polysilicon electrode seeding layer in the NMOS region and the silicon germanium electrode layer in the PMOS region, respectively; and
   patterning the stacked electrode layers to form gate electrodes in the NMOS and PMOS regions, respectively.

14. The method as recited in claim 13, further comprising performing an annealing process so as to diffuse germanium of the silicon germanium electrode layer to the lower polysilicon electrode seeding layer at any time subsequent to forming the silicon germanium electrode layer.

15. The method as recited in claim 14, wherein the amorphous silicon layer formed on the silicon germanium electrode layer serves to prevent the germanium from diffusing to the upper polysilicon electrode layer in the annealing process.

16. The method as recited in claim 15, wherein the amorphous electrode layer comprises amorphous silicon.

17. The method as recited in claim 13, wherein the dry etch uses gas containing carbon atoms and fluorine atoms.

18. The method as recited in claim 13, wherein the wet etch uses a mixed etchant of $HNO_3$ of 1.2 volume percent and $H_2O_2$ of 4.8 volume percent.

19. The method as recited in claim 13, after forming gate electrodes on the NMOS and PMOS regions respectively, further comprising:
   forming an insulating layer sidewall spacer on both sidewalls of the respective gate electrode;
   using the sidewall spacer and the gate electrode as an ion implanting mask, forming source/drain regions in the semiconductor substrate adjacent side portions of the gate electrode; and
   forming a refractory metal layer in the source/drain regions.

20. The method as recited in claim 19, further comprising performing an annealing process so as to diffuse the germanium of the silicon germanium electrode layer to the lower polysilicon electrode seeding layer at any time subsequent to forming the silicon germanium electrode layer.

21. The method as recited in claim 20, further comprising performing an annealing process after forming the refractory metal layer.

* * * * *